United States Patent [19]

Tamukai

[11] Patent Number: 4,613,873
[45] Date of Patent: Sep. 23, 1986

[54] PRINTER WITH SUPPLY VOLTAGE CONTROL CIRCUIT

[75] Inventor: Tadao Tamukai, Tamayama, Japan

[73] Assignee: Alps Electric Co., Ltd., Japan

[21] Appl. No.: 666,478

[22] Filed: Oct. 30, 1984

[30] Foreign Application Priority Data

Oct. 28, 1983 [JP] Japan ............................ 58-166989[U]

[51] Int. Cl.$^4$ ............................ G01D 9/00; H02H 3/24
[52] U.S. Cl. .................................. 346/33 R; 361/92; 307/64
[58] Field of Search .................. 346/33 R; 361/92; 340/663; 307/64, 66, 75

[56] References Cited

U.S. PATENT DOCUMENTS

| | | | |
|---|---|---|---|
| 3,569,741 | 3/1971 | Bolick | 346/33 |
| 4,107,697 | 8/1978 | McCracken | 346/33 R |
| 4,493,000 | 1/1985 | Edwards | 361/92 |

Primary Examiner—E. A. Goldberg
Assistant Examiner—Mark Reinhart
Attorney, Agent, or Firm—Guy W. Shoup

[57] ABSTRACT

A printer comprising a printing mechanism, a control circuit which controls said printing mechanism and a power supply including battery, wherein said power supply provides the first stabilized power source circuit which converts an output voltage of said battery to the predetermined first supply voltage and then supplies it to said printing mechanism and the second stabilized power source circuit which converts an output voltage of said battery to the second supply voltage which is lower than said first supply voltage and then supplies it to said control circuit, and moreover a detecting circuit, which is composed of a transistor and resistors and detects that difference between the supply voltages of said first stabilized power source circuit and second stabilized power source circuit has reached a value lower than the predetermined threshold value, is also provided, and moreover the printing operation is controlled on the basis of an output signal of the detecting circuit.

3 Claims, 2 Drawing Figures

PRINTER WITH SUPPLY VOLTAGE CONTROL CIRCUIT

FIELD OF THE INVENTION

This invention relates to a printer having a power supply which includes a battery, and more particularly to a circuit for such printer which monitors the voltage supplied from the battery to prevent incorrect operation when the battery voltage falls too low.

BACKGROUND OF THE INVENTION

Many small printers use a battery as the main power supply and the output voltage of the battery is lowered as the power is consumed in such known printers. When the output voltage of the battery falls below a predetermined value, the printer may often operate incorrectly. Therefore, it is necessary to detect when the output voltage of the battery falls below a predetermined value so that the battery can replaced or recharged. A conventional circuit for detecting when the battery voltage falls below a predetermined minimum is shown in FIG. 1.

In FIG. 1, a power supply voltage (a) of typically 9 V is supplied to a first stabilized power source circuit 3 and a second stabilized power source circuit 4 from the battery 1 through the power switch 2. A specified reference voltage (b), for example 5 V, is supplied to the printing mechanism 5 from the first stabilized power source circuit 3, while a specified reference voltage (c), for example 5 V, is supplied to a control circuit 6 from the second stabilized power source circuit 4. Moreover, in the conventional circuit shown in FIG. 1, the detecting circuit which detects a drop of the power source voltage (a) supplied from the battery 1 is comprised of a current-limiting resistor 7, a zener diode 8, a semi-fixed resistor 9, a fixed resistor 10 and a comparing circuit 11. A constant voltage (d), for example 2 V, generated by the current limiting resistor 7 and zener diode 8 is directed to one input of the comparing circuit 11, and a voltage (e) divided by the semi-fixed resistor 9 and fixed resistor 10 from the reference voltage (b) output from said first stabilized power source circuit is applied to the other input of the comparing circuit 11. By adjusting the resistance value of the semi-fixed resistor 9, the divided voltage (e) is set to equal the constant voltage (d) when the reference voltage (b) becomes the allowable minimum value 9. Therefore, by comparing said constant voltage (d) with the divided voltage (e) in the comparing circuit 11, it can be determined that the reference voltage (b) has reached the allowable minimum value due to a drop of the power source voltage (a) of the battery 1.

However, this detecting circuit used in the conventional printer includes rather complicated circuit structures and, therefore, not only is the cost increased, but also fine adjustment of semi-fixed resistor is required for increasing detection accuracy. Accordingly, a printer which can be obtained economically by utilizing a simplified detecting circuit has been awaited.

SUMMARY OF THE INVENTION

It is an object of this invention to provide a printer which has attained such requirements. For this purpose, this invention provides a printer comprising a printing mechanism, a control circuit which controls the printing mechanism and a power supply including a battery, wherein a first stabilized power source circuit converts an output voltage of the battery to a predetermined first supply voltage for the printing mechanism, and a second stabilized power source circuit converts an output voltage of the battery to the second supply voltage for a control circuit of the printer. The second supply voltage is lower than the first supply voltage and a detecting circuit is provided to detect when the difference between the supply voltages has reached a value lower than a predetermined threshold value.

DETAILED DESCRIPTION OF THE INVENTION

An embodiment of the present invention is described below with reference to FIG. 2.

Figure 1:
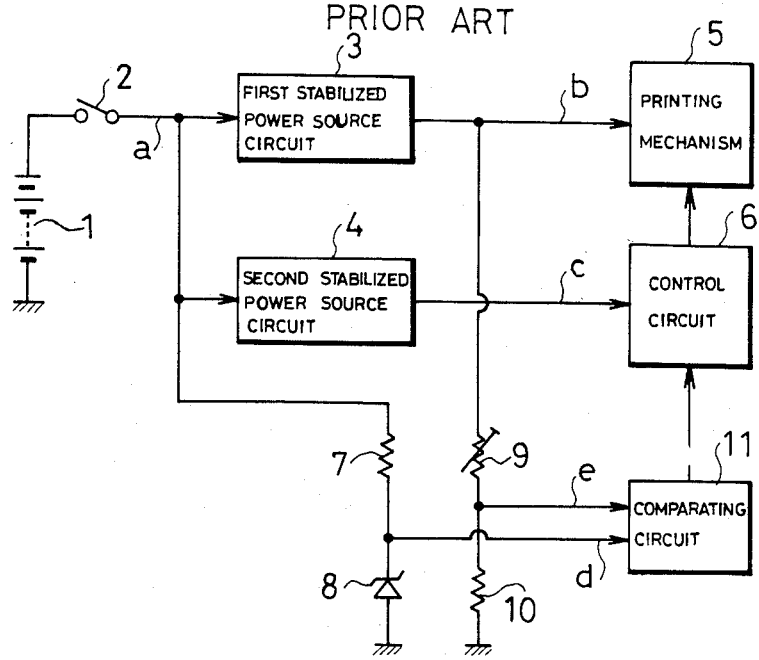
FIG. 1 is a block diagram indicating the conventional structure of circuitry for a printer which detects battery voltage.
Figure 2:
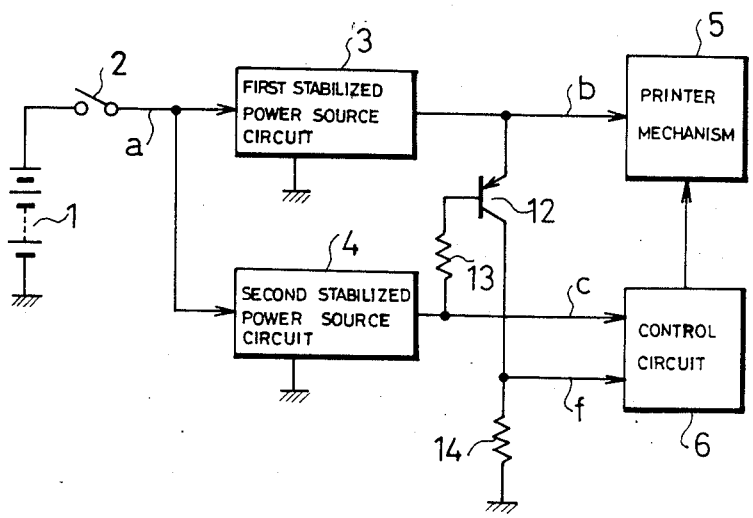
FIG. 2 is a block diagram of an embodiment of a circuitry according to the present invention.

For FIG. 2, numerals 1 to 6 correspond to those of FIG. 1, and numeral 12 notes a transistor while numerals 13 and 14 refer to resistors.

The printer of this invention basically has the structure similar to the prior art of FIG. 1, except for a detecting circuit which is comprised of the transistor 12 and resistors 13 and 14. However, an operating voltage of the printing mechanism 5 is set to a voltage which is higher than that of the control circuit 6 in such a manner that the operating voltage of the printing mechanism 5 is set to 6 V, for example, and the operating voltage of the control circuit 6 is set to 5 V, for example. Therefore, the supply voltage (b) supplied to the printing mechanism 5 from the first stabilized power source circuit 3 and the supply voltage (c) supplied to control circuit 6 from the second stabilized power source circuit 4 are set respectively corresponding to said operating voltages. The supply voltage (b) is applied to the emitter of the transistor 12, while the supply voltage (c) is applied to the base thereof through a resistor 13. Namely, the ON-OFF operations of the transistor 12 depend on the voltage difference between the supply voltages (b) and (c). In addition, a collector voltage f of the transistor 12 changes depending on the ON-OFF operations of the transistor 12. In other words, it becomes high during ON and low during OFF.

When the supply voltages (b) and (c) drop due to a drop in the power source voltage (a) supplied from the battery 1 because of power consumption as described above, the supply voltage (b) drops first because the supply voltage (b) is set higher than the supply voltage (c). Therefore, the transistor 12 can be chosen to turn OFF from its ON state before the supply voltage to be supplied to the control circuit 6 drops by setting the operating voltage of transistor 12 to an adequate value. Accordingly, it can be detected that the power source voltage (a) of the battery 1 has dropped up to an allowable voltage value, by detecting a collector voltage f which changes depending on the ON and OFF state of transistor 12 in the control circuit 6. Such process will then be described below in more detail.

For example, when the initial value of the power source voltage (a) is set to 9 V, a supply voltage (b) is set to 6 V, a supply voltage (c) is set to 5 V and the supply voltage (b) when the power source voltage (a) drops up to the allowable voltage value is set to 5.6 V, the operating voltage of the transistor 12 should be 0.6 V. Namely, the transistor 12 turns ON when a voltage difference between the supply voltages (b) and (c) is 0.6 V or higher, or turns OFF when it is under 0.6 V. Accordingly, when the power source voltage (a) is in the sufficiently high range, a voltage difference between the supply voltages (b) and (c) is 1 V and, therefore, the transistor 12 is in the ON state and a collector voltage f is in the high level. As a result, it is detected that the power source voltage (a) is higher than the allowable voltage in the control circuit 6.

The collector voltage f remains in such a high level until the supply voltage (b) reaches a 5.6 V due to a drop of the power source voltage (a) (under this condition, said supply voltage (c) is kept at 5 V and the voltage difference between said supply voltages (b) and (c) is 0.6 V or higher). However, when voltage difference between the supply voltages (b) and (c) becomes 0.6 V or less, the transistor 12 turns OFF and thereby the emitter voltage f is set to a low level. As a result, it is detected in the control circuit 6 that the power source voltage (a) sent from the battery 1 drops to an allowable value or less and the printing operation is suspended depending on such detection signal. During this period, since a supply voltage (c) to the control circuit 6 which requires comparatively high operating voltage accuracy is kept at 5 V, it does not adversely influence operation of the control circuit 6.

In the embodiment shown in FIG. 2 described above, drop of the power source voltage (a) is detected depending on the ON and OFF operations of a transistor 12. This invention, however, is not limited to such structure and any means detecting the voltage difference between the supply voltages (b) and (c) may be employed.

As described above, this invention is capable of detecting a drop of the power source voltage with a detecting means providing a simplified circuit structure and provides a very economical printer.

What is claimed is:

1. A printer comprising a printing mechanism, a control circuit for controlling operation of said printing mechanism and a power supply including a battery, wherein said power supply includes a first stabilized power source circuit which converts an output voltage of said battery to a predetermined first supply voltage and then supplies it to said printing mechanism and a second stabilized power source circuit which converts an output voltage of said battery to a second supply voltage which is lower than said first supply voltage and then supplies it to said control circuit, and moreover a detecting circuit which detects when difference between the supply voltages of said first stabilized power source circuit and second stabilized power source circuit has reached a value lower than a predetermined threshold value.

2. A printer as set forth in claim 1 wherein the printing operation is controlled on the basis of an output signal of said detecting circuit.

3. A printer as set forth in claim 1, wherein said detecting circuit comprises a transistor of which a collector is connected to said first supply voltage, a base is connected to said second supply voltage, and an emitter thereof provides an output signal to said control circuit indicative of an ON or OFF condition of said transistor depending on the difference between said supply voltages.

* * * * *